US012588230B2

(12) United States Patent
Tsai et al.

(10) Patent No.: US 12,588,230 B2
(45) Date of Patent: Mar. 24, 2026

(54) SILICON LAYER-BASED SILICIDE CONTACTS

(71) Applicant: Taiwan Semiconductor Manufacturing Company, Ltd., Hsinchu (TW)

(72) Inventors: Yi-He Tsai, Hsinchu (TW); Yi-Hung Chang, Hsinchu (TW); Lung Chen, Hsinchu (TW); Long-Jie Hong, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 437 days.

(21) Appl. No.: 18/170,411

(22) Filed: Feb. 16, 2023

(65) Prior Publication Data

US 2024/0105817 A1 Mar. 28, 2024

Related U.S. Application Data

(60) Provisional application No. 63/410,425, filed on Sep. 27, 2022.

(51) Int. Cl.
*H10D 84/00* (2025.01)
*H01L 23/528* (2006.01)
(Continued)

(52) U.S. Cl.
CPC ....... *H10D 30/024* (2025.01); *H01L 23/5283* (2013.01); *H10D 30/6211* (2025.01); *H10D 64/017* (2025.01); *H10D 64/021* (2025.01);

*H10D 84/013* (2025.01); *H10D 84/0147* (2025.01); *H10D 84/0158* (2025.01); *H10D 84/038* (2025.01)

(58) Field of Classification Search
CPC ............. H10D 84/013; H10D 84/0158; H10D 30/024; H10D 30/0212; H10D 30/062; H10D 30/6219
See application file for complete search history.

(56) References Cited

U.S. PATENT DOCUMENTS

2018/0174913 A1* 6/2018 More ...................... H10D 64/62
2018/0374749 A1* 12/2018 Wong ................ H01L 21/76876
(Continued)

FOREIGN PATENT DOCUMENTS

TW      202013530 A    4/2020
TW      202234587 A    9/2022

OTHER PUBLICATIONS

Office Action issued in connection with Taiwan Appl. No. 112134266 dated May 29, 2024.

*Primary Examiner* — Reema Patel
(74) *Attorney, Agent, or Firm* — Foley & Lardner LLP

(57) ABSTRACT

A semiconductor device includes a semiconductor channel. The semiconductor device includes a metal gate structure disposed over the semiconductor channel. The semiconductor device includes a gate electrode having a bottom surface contacting an upper surface of the metal gate structure. The gate electrode has its side portions extending from its top surface toward the semiconductor fin with a first depth and a central portion extending from its top surface toward the semiconductor fin with a second depth, the first depth being substantially greater than the second depth.

19 Claims, 18 Drawing Sheets

300

(51) Int. Cl.

| | | |
|---|---|---|
| *H10D 30/01* | (2025.01) | |
| *H10D 30/62* | (2025.01) | |
| *H10D 64/01* | (2025.01) | |
| *H10D 84/01* | (2025.01) | |
| *H10D 84/03* | (2025.01) | |

(56) References Cited

U.S. PATENT DOCUMENTS

2020/0105593 A1* 4/2020 Wu .................... H10D 84/0158
2020/0365698 A1* 11/2020 Tsai ........................ H10D 64/01

* cited by examiner

SILICON LAYER-BASED SILICIDE CONTACTS

CROSS-REFERENCE TO RELATED APPLICATIONS

This application claims priority to and the benefit of U.S. Provisional Patent App. No. 63/410,425, filed Sep. 27, 2022, the entire disclosure of which is incorporated by reference herein.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
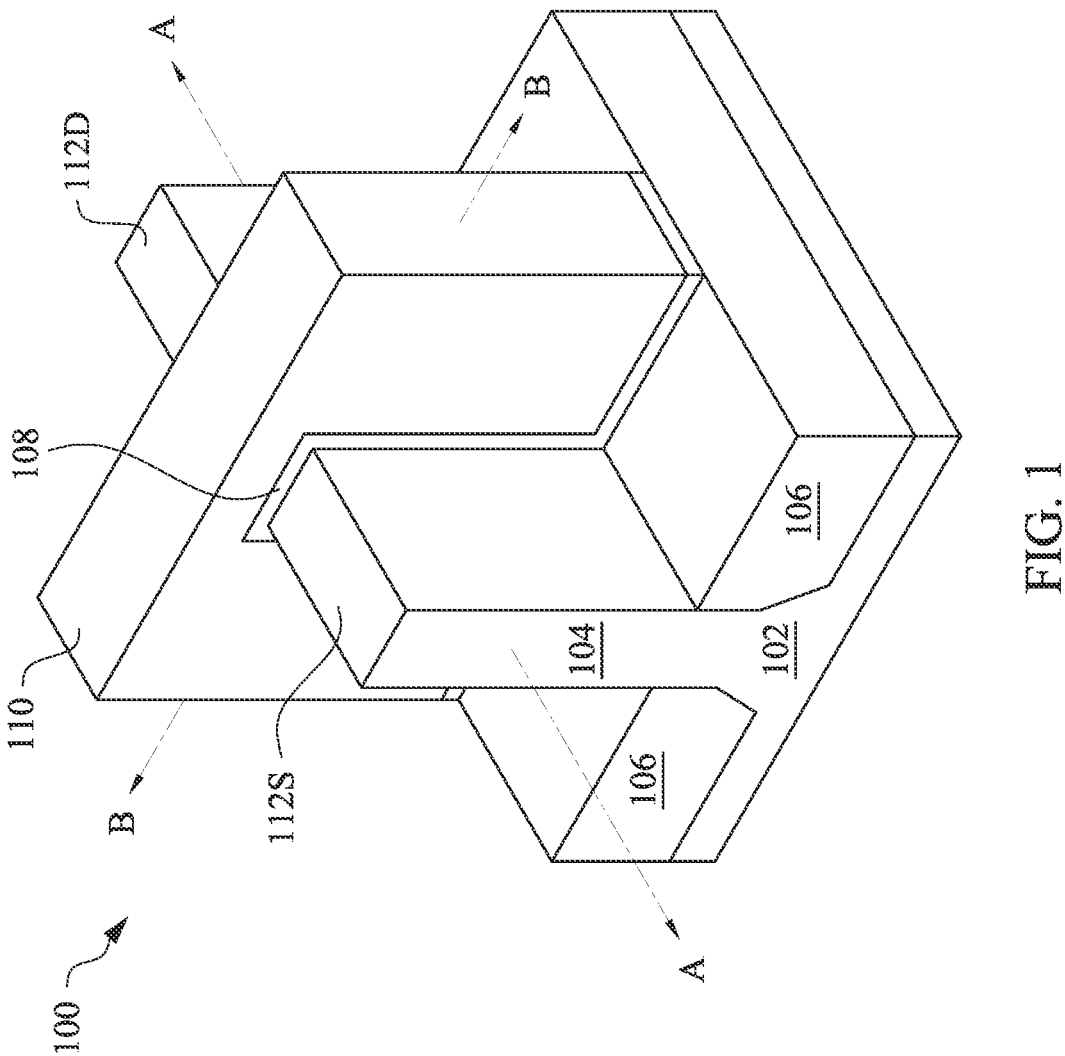
FIG. 1 illustrates a perspective view of a fin field-effect transistor (FinFET) device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. References to "or" may be construed as inclusive so that any terms described using "or" may indicate any of a single, more than one, and all of the described terms.

In general, source/drain regions of a semiconductor device can include a silicide region. For example, the silicide region can electrically connect the source/drain region and an interconnect structure. The silicide region can be formed from depositing a silicon and metal (e.g., titanium) over silicon germanium, and wherein the metal interacts with the silicon or the silicon germanium (e.g., consumes the silicon or germanium during an processing operation such as annealing). The addition of the silicon (e.g., intrinsic silicon) can minimize a portion of the silicon germanium which is consumed to form a metal silicide (e.g., $TiSi_2$). Such a reduction in the consumption of the silicon germanium can avoid extrusion (e.g., the exfiltration of the titanium from the source/drain). Moreover, the silicon layer can be intrinsic silicon or doped silicon. The use of intrinsic silicon (or control of any dopants therein) can reduce or control a buildup of dopants (e.g., boron) with the silicon-germanium, such as along a boundary of the source/drain area. The deposition of silicon or a metal can also increase a contact area between the silicon germanium portion of the source/drain and the silicide layer (e.g., which may decrease a resistance therebetween). The formation of the silicide from deposited silicon and the metal can maintain a relatively consistent thickness (e.g., according to the consistency of the deposition process relative to other approaches).

FIG. 1 illustrates a perspective view of an example FinFET device 100, in accordance with various embodiments. The FinFET device 100 includes a substrate 102 and a fin 104 protruding above the substrate 102. Isolation regions 106 are formed on opposing sides of the fin 104, with the fin 104 protruding above the isolation regions 106. A gate dielectric 108 is along the sidewalls (which may not be depicted according to some views) of the fin 104 and over a top surface of the fin 104, and a gate 110 is over the gate dielectric 108. Source/drain regions 112D and 112S are in the fin 104 and on opposing sides of the gate dielectric 108 and the gate 110. The source/drain regions 112D and 112S extend outward from the gate 110. FIG. 1 is provided as a reference to illustrate a number of cross-sections in subsequent figures. For example, cross-section B-B extends along a longitudinal axis of the gate 110 of the FinFET device 100. Cross-section A-A is perpendicular to cross-section B-B and is along a longitudinal axis of the fin 104 and in a direction of, for example, a current flow between the source/drain regions 112S/112D. Subsequent figures refer to these reference cross-sections for clarity.

Figure 2:
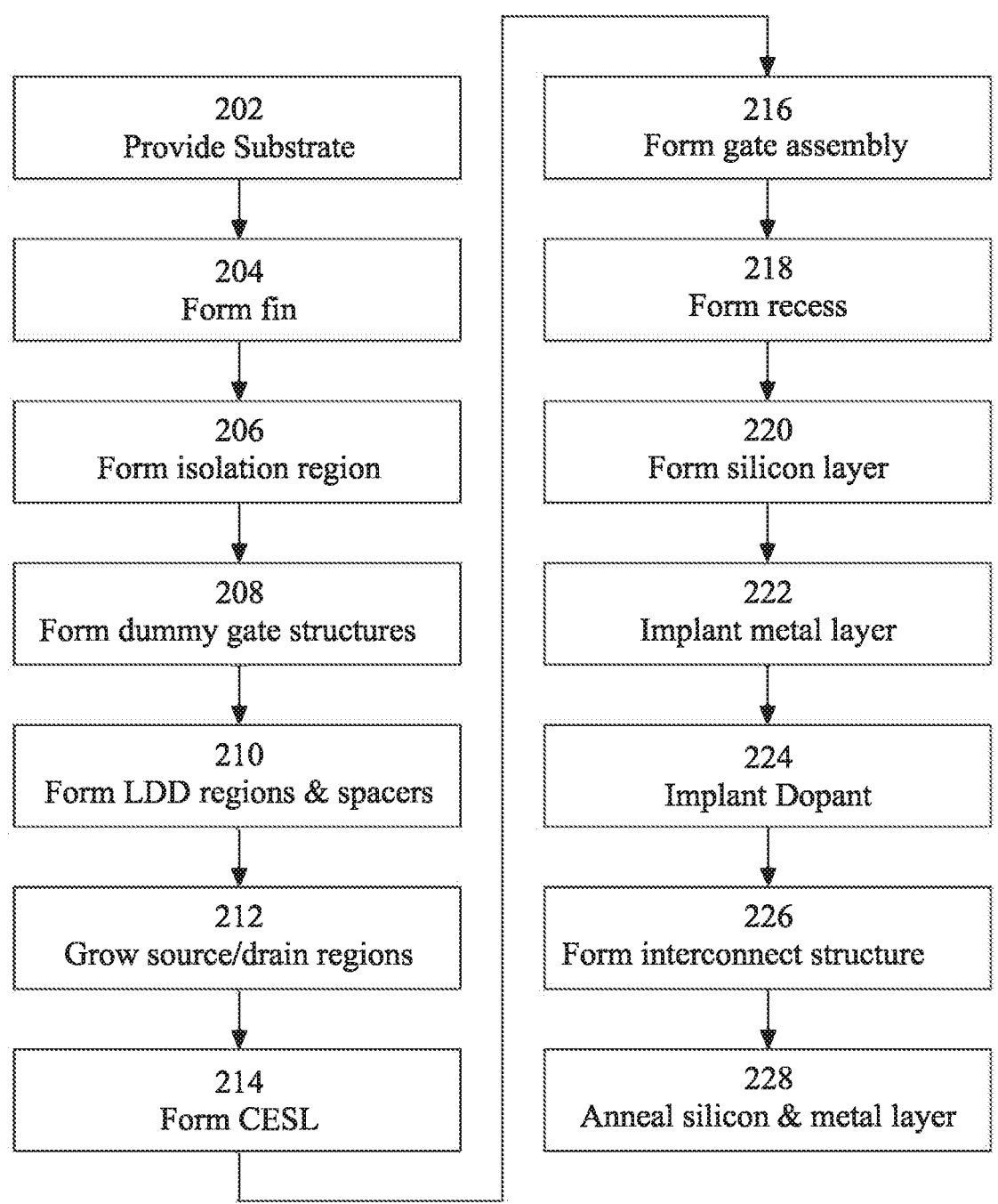
FIG. 2 illustrates a flow chart of an example method for making a non-planar transistor device, in accordance with some embodiments.

FIG. 2 illustrates a flowchart of a method 200 to form a non-planar transistor device, according to one or more embodiments of the present disclosure. For example, at least some of the operations of the method 200 can be used to form a FinFET device (e.g., FinFET device 100), a nanosheet transistor device, a gate-all-around transistor device, a nanowire transistor device, a vertical transistor, or the like. It is noted that the method 200 is merely an example, and is not intended to limit the present disclosure. Accordingly, it is understood that additional operations may be provided before, during, and after the method 200 of FIG. 2, and that some other operations may only be briefly described herein. In some embodiments, operations of the method 200 may be associated with cross-sectional views of an example FinFET device at various fabrication stages as shown in FIGS. 3, 4, 5, 6, 7, 8, 9, 10, 11, 12, 13, 14, 15, 16, 17, 18, and 19 respectively, which will be discussed in further detail below.

In brief overview, the method 200 starts with operation 202 of providing a substrate. The method 200 continues to operation 204 of forming a fin. The method 200 continues to operation 206 of forming isolation regions. The method 200 continues to operation 208 of forming dummy gate structures. The dummy gate structures may straddle a (e.g., central) portion of the fin. The method 200 continues to operation 210 of forming lightly doped drain (LDD) regions and gate spacers. The gate spacers can extend along sidewalls of the dummy gate structure. The method 200 continues to operation 212 of growing source/drain regions. The method 200 continues to operation 214 of forming a contact etch stop layer (CESL). The method continues to operation 216 of forming a gate assembly. The method 200 continues to operation 218 of forming a recess in the source/drain regions. The method 200 continues to operation 220 of forming a silicon layer. The method 200 continues to operation 222 of forming a metal layer. The method 200 continues to operation 224 of implanting a dopant into the silicon layer or the metal layer. The method 200 continues to operation 226 of forming an interconnect structure or portion or layer thereof. The method 200 continues to operation 228 of annealing at least the silicon layer and metal layer.

As mentioned above, FIGS. 3-19 each illustrates, in a cross-sectional view, a portion of a FinFET device 300 at various fabrication stages of the method 200 of FIG. 2. The FinFET device 300 is substantially similar to the FinFET device 100 shown in FIG. 1, but with multiple gate structures. For example, FIGS. 3-6, 9-11, 13, 15-16, illustrate cross-sectional views of the FinFET device 300 along cross-section B-B (as indicated in FIG. 1); FIGS. 7-8, 12, 14, and 17-19 illustrate a cross-sectional views of the FinFET device 300 along cross-section A-A (as indicated in FIG. 1). Although FIGS. 3-19 illustrate the FinFET device 300, it is understood the FinFET device 300 may include a number of other devices such as inductors, fuses, capacitors, coils, etc., which are not shown in FIGS. 3-19, for purposes of clarity of illustration.

Figure 3:
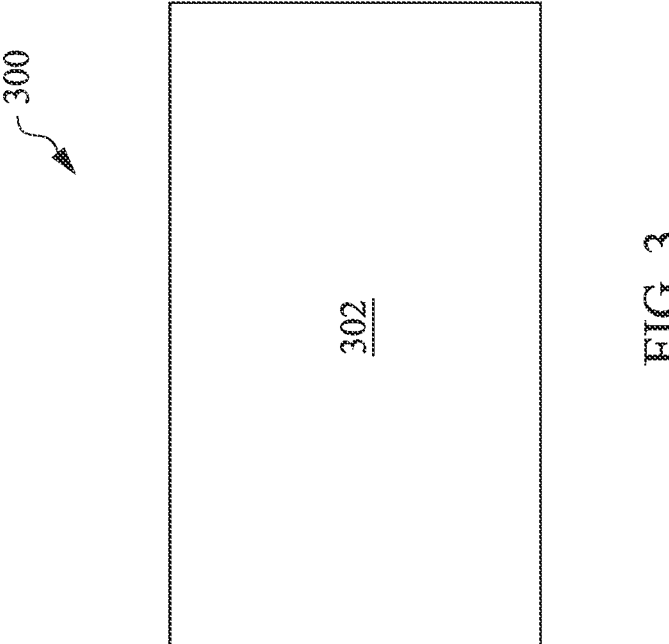

Corresponding to operation 202 of FIG. 2, FIG. 3 is a cross-sectional view of the FinFET device 300 including a semiconductor substrate 302 at one of the various stages of fabrication. The substrate 302 may be a semiconductor substrate, such as a bulk semiconductor, a semiconductor-on-insulator (SOI) substrate, or the like, which may be doped (e.g., with a p-type or an n-type dopant) or undoped. The substrate 302 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 302 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 4:
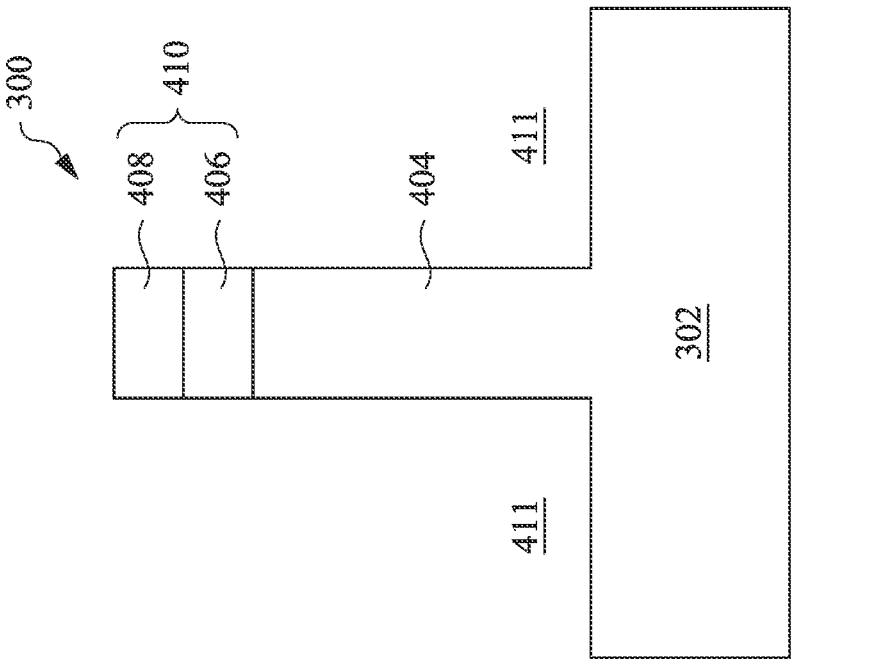
FIGS. 3, 4, 5, 6, 7, 8, 9, 10, 11, 12, 13, 14, 15, 16, 17, 18, 19, and 20 illustrate cross-sectional views of an example FinFET device (or a portion of the example FinFET device) during various fabrication stages, made by the method of FIG. 2, in accordance with some embodiments.

Corresponding to operation 204 of FIG. 2, FIG. 4 is a cross-sectional view of the FinFET device 300 including a (semiconductor) fin 404 (i.e., fin structure) at one of the various stages of fabrication. Although one fin is shown in the illustrated embodiment of FIG. 4 (and the following figures), it should be appreciated that the FinFET device 300 can include any number of fins while remaining within the scope of the present disclosure. In some embodiments, the fin 404 is formed by patterning the substrate 302 using, for example, photolithography and etching techniques. For example, a mask layer, such as a pad oxide layer 406 and an overlying pad nitride layer 408, is formed over the substrate 302. The pad oxide layer 406 may be a thin film comprising silicon oxide formed, for example, using a thermal oxidation process. The pad oxide layer 406 may act as an adhesion layer between the substrate 302 and the overlying pad nitride layer 408. In some embodiments, the pad nitride layer 408 is formed of silicon nitride, silicon oxynitride, silicon carbonitride, the like, or combinations thereof. The pad nitride layer 408 may be formed using low-pressure chemical vapor deposition (LPCVD) or plasma enhanced chemical vapor deposition (PECVD), for example.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer 406 and pad nitride layer 408 to form a patterned mask 410, as illustrated in FIG. 4.

The patterned mask 410 is subsequently used to pattern exposed portions of the substrate 302 to form trenches (or openings) 411, thereby defining a fin 404 between adjacent trenches 411 as illustrated in FIG. 4. When multiple fins are formed, such a trench may be disposed between any adjacent ones of the fins. In some embodiments, the fin 404 is formed by etching trenches in the substrate 302 using, for example, reactive ion etch (RIE), neutral beam etch (NBE), the like, or combinations thereof. The etching may be anisotropic. In some embodiments, the trenches 411 may be strips (viewed from the top) parallel to each other, and closely spaced with respect to each other. In some embodiments, the trenches 411 may be continuous and surround the fin 404. The fin 404 may also be referred to as fin structures 404 hereinafter.

The fin 404 may be patterned by any suitable method. For example, the fin 404 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin 404.

Figure 5:
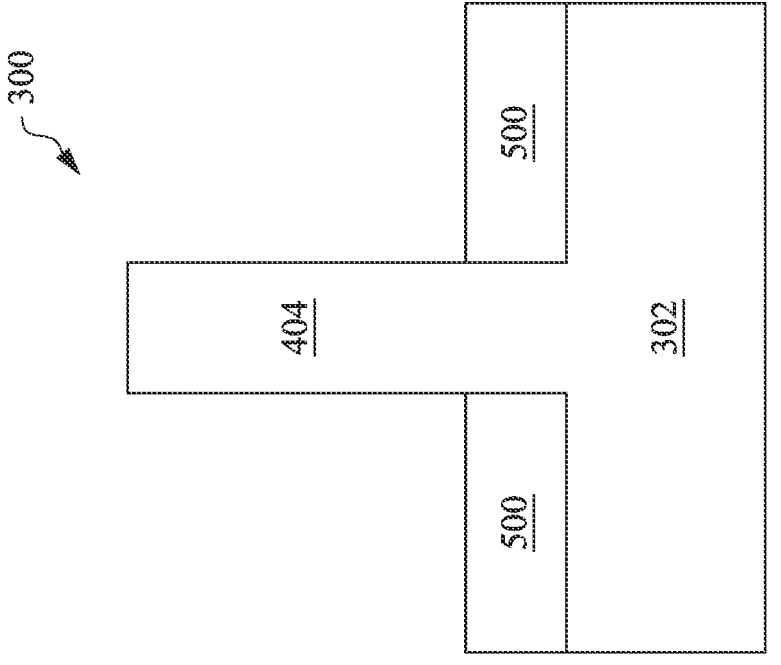

Corresponding to operation 206 of FIG. 2, FIG. 5 is a cross-sectional view of the FinFET device 300 including isolation regions 500 at one of the various stages of fabrication. The isolation regions 500, which are formed of an insulation material, can electrically isolate neighboring fins from each other. The insulation material may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used. In the illustrated embodiment, the insulation material is silicon oxide formed by a FCVD process. An anneal process may be performed once the insulation material is formed. A planarization process, such as a chemical mechanical polish (CMP), may remove any excess insulation material and form top surfaces of the isolation regions 500 and a top surface of the fin 404 that are coplanar (not shown, the isolation regions 500 will be recessed as shown in FIG. 5). The patterned mask 410 (as shown in FIG. 4) may also be removed by the planarization process.

In some embodiments, the isolation regions 500 include a liner, e.g., a liner oxide (not shown), at the interface between each of the isolation regions 500 and the substrate 302 (fin 404). In some embodiments, the liner oxide is formed to reduce crystalline defects at the interface between the substrate 302 and the isolation region 500. Similarly, the liner oxide may also be used to reduce crystalline defects at the interface between the fin 404 and the isolation region 500. The liner oxide (e.g., silicon oxide) may be a thermal oxide formed through a thermal oxidation of a surface layer of the substrate 302, although other suitable method may also be used to form the liner oxide.

Next, the isolation regions 500 are recessed to form shallow trench isolation (STI) regions 500, as shown in FIG. 5. The isolation regions 500 are recessed such that the upper portions of the fin 404 protrude from between neighboring STI regions 500. Respective top surfaces of the STI regions 500 may have a flat surface (as illustrated), a convex surface, a concave surface (such as dishing), or combinations thereof. The top surfaces of the STI regions 500 may be formed flat, convex, and/or concave by an appropriate etch. The isolation regions 500 may be recessed using an acceptable etching process, such as one that is selective to the material of the isolation regions 500. For example, a dry etch or a wet etch using dilute hydrofluoric (DHF) acid may be performed to recess the isolation regions 500.

FIGS. 3 through 5 illustrate an embodiment of forming one or more fins (such as fin 404), but a fin may be formed in various different processes. For example, a top portion of the substrate 302 may be replaced by a suitable material, such as an epitaxial material suitable for an intended type (e.g., n-type or p-type) of semiconductor devices to be formed. Thereafter, the substrate 302, with epitaxial material on top, is patterned to form the fin 404 that includes the epitaxial material.

As another example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form one or more fins.

In yet another example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form one or more fins.

In embodiments where epitaxial material(s) or epitaxial structures (e.g., the heteroepitaxial structures or the homoepitaxial structures) are grown, the grown material(s) or structures may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fin 404 may include silicon germanium ($Si_xGe_{1-x}$, where x can be between 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 6:
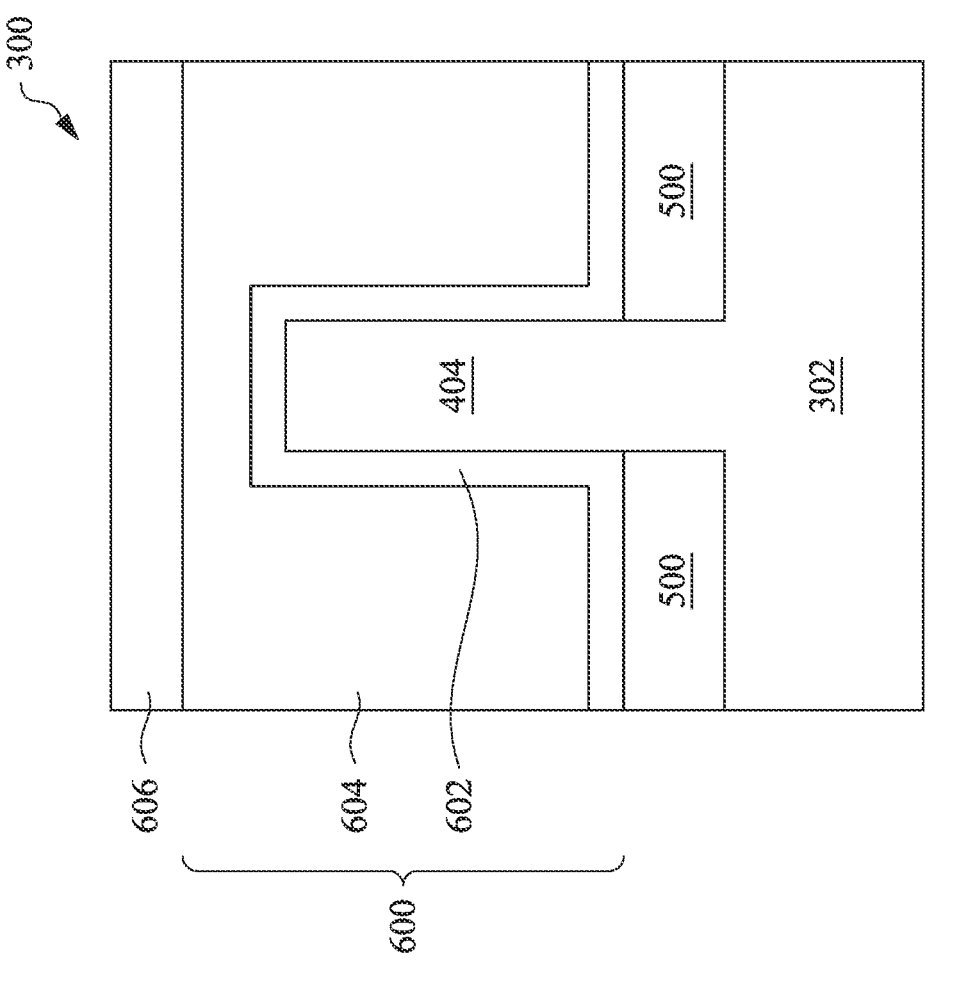
Figure 6:

Corresponding to operation 208 of FIG. 2, FIG. 6 is a cross-sectional view of the FinFET device 300 including a dummy gate structure 600 at one of the various stages of fabrication. The dummy gate structure 600 includes a dummy gate dielectric 602 and a dummy gate 604, in some embodiments. A mask 606 may be formed over the dummy gate structure 600. To form the dummy gate structure 600, a dielectric layer is formed on the fin 404. The dielectric layer may be, for example, silicon oxide, silicon nitride, multilayers thereof, or the like, and may be deposited or thermally grown.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using photolithography and etching techniques to form the mask 606. The pattern of the mask 606 then may be transferred to the gate layer and the dielectric layer by an etching technique to form the dummy gate 604 and the underlying dummy gate dielectric 602, respectively. The dummy gate 604 and the dummy gate dielectric 602 cover a central portion (e.g., a channel region) of the fin 404. The dummy gate 604 may also have a lengthwise direction (e.g., direction B-B of FIG. 1) substantially perpendicular to the lengthwise direction (e.g., direction of A-A of FIG. 1) of the fin 404.

The dummy gate dielectric 602 is shown to be formed over the fin 404 (e.g., over top surfaces and sidewalls of the fin 404) and over the STI regions 500 in the example of FIG. 6. In other embodiments, the dummy gate dielectric 602 may be formed by, e.g., thermal oxidization of a material of the fin 404, and therefore, may be formed over the fin 404 but not over the STI regions 500. In some embodiments, a gate may be formed in place of a dummy gate. For example, in a gate first process, the gate can be formed and etched back to allow for self-aligned contacts to the source or drain regions of the FinFET device 300, and a gate electrode can, thereafter, be formed, extended or connected to (e.g., in the depicted plane or a plane laterally offset therefrom). It should be appreciated that these and other variations are still included within the scope of the present disclosure.

Figure 7:
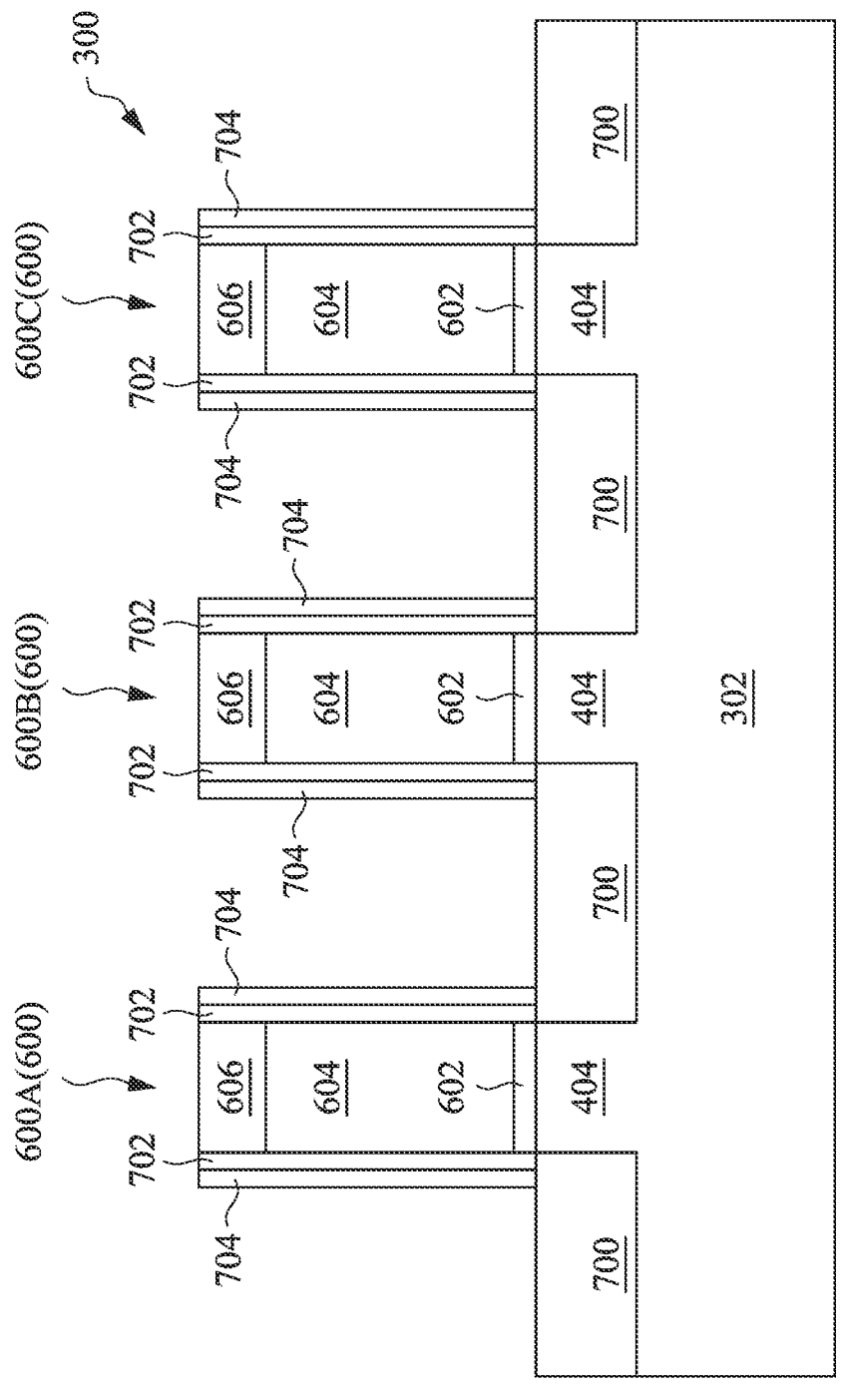
Figure 8:
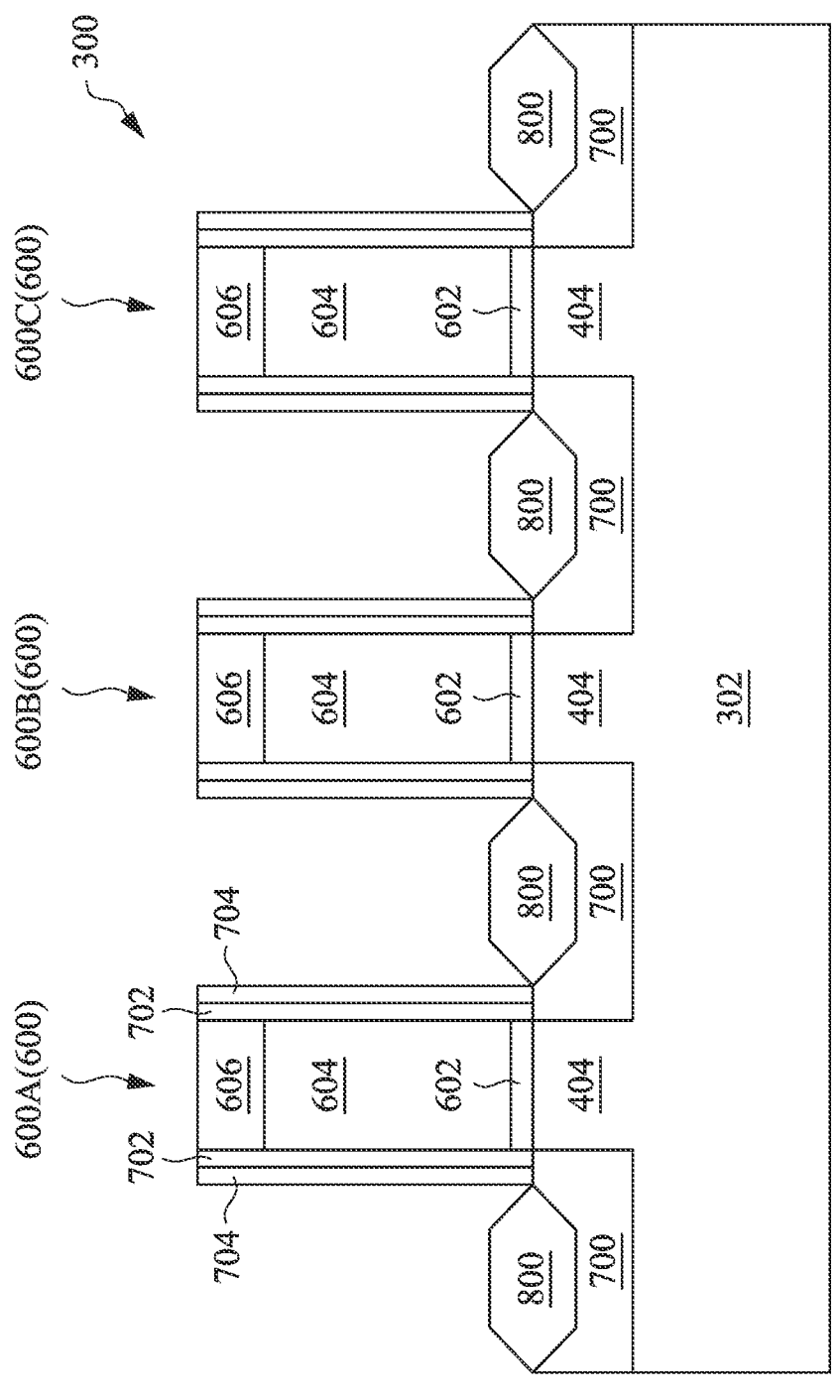

FIGS. 7-8 illustrate the cross-sectional views of further processing (or making) of the FinFET device 300 along cross-section A-A (along a longitudinal axis of the fin 404), as shown in FIG. 1. In brief overview, three dummy gate structures 600A, 600B, and 600C are illustrated over the fin 404 in the examples of FIGS. 7-8. For simplicity, the dummy gate structures 600A, 600B, and 600C may sometimes be collectively referred to as dummy gate structures 600. It should be appreciated that more or less than three dummy gate structures can be formed over the fin 404, while remaining within the scope of the present disclosure. Source/drain regions 800 are formed between the dummy gate structures 600 (or, in some embodiments, such as gate-first embodiments, between the gates). The source/drain regions 800 may correspond to the dummy gate structures 600 (or gates) to form transistors or proto-transistors (e.g., lacking a gate or gate electrode) which can thereafter be connected by an interconnect structure 1702 to form circuits.

Corresponding to operation 210 of FIG. 2, FIG. 7 is a cross-sectional view of the FinFET device 300 including a number of lightly doped drain (LDD) regions 700 formed in the fin 404 at one of the various stages of fabrication. The LDD regions 700 may be formed by a plasma doping process. The plasma doping process may include forming and patterning masks such as a photoresist to cover the regions of the FinFET device 300 that are to be protected from the plasma doping process. The plasma doping process may implant n-type or p-type impurities in the fin 404 to form the LDD regions 700. For example, p-type impurities, such as boron, may be implanted in the fin 404 to form the LDD regions 700 for a p-type device. In another example, n-type impurities, such as phosphorus, may be implanted in the fin 404 to form the LDD regions 700 for an n-type device. In some embodiments, the LDD regions 700 abut one of the channel regions of the FinFET device 300 (e.g., the central portion of the fin 404 overlaid by one of the dummy gate structures 600). Portions of the LDD regions 700 may extend under the dummy gate structure 600 and into the channel region of the FinFET device 300. FIG. 7 illustrates a non-limiting example of the LDD regions 700. Other configurations, shapes, and formation methods of the LDD regions 700 are also possible and are fully intended to be included within the scope of the present disclosure. For example, the LDD regions 700 may be formed after gate spacers 702/704, which will be discussed below, are formed. In some embodiments, the LDD regions 700 are omitted.

Still referring to FIG. 7, after the LDD regions 700 are formed, in some embodiments, first gate spacers 702 are formed around (e.g., along and contacting the sidewalls of) the dummy gate structures 600, and second gate spacers 704 are formed around (e.g., along and contacting the sidewalls of) the first gate spacers 702. For example, the first gate spacer 702 may be formed on opposing sidewalls of the dummy gate structure 600. The second gate spacer 704 may be formed on the first gate spacer 702. It should be understood that any number of gate spacers can be formed around the dummy gate structures 600 while remaining within the scope of the present disclosure. The spacers can be formed from various nonconductive materials (e.g., may be dielectric spacers).

The first gate spacer 702 may be a low-k spacer and may be formed of a suitable dielectric material, such as silicon oxide, silicon oxycarbonitride, or the like. The second gate spacer 704 may be formed of a nitride, such as silicon nitride, silicon oxynitride, silicon carbonitride, the like, or combinations thereof. Any suitable deposition method, such as thermal oxidation, chemical vapor deposition (CVD), or the like, may be used to form the first gate spacer 702 and the second gate spacer 704. In accordance with various embodiments, the first gate spacer 702 and the second gate spacer 704 are formed of different materials to provide etching selectivity in subsequent processing.

The first gate spacer 702, the second gate spacer 704, and any additional spacers may sometimes be collectively referred to as gate spacers 702/704. In some embodiments, fewer or additional gate spacers can be included, which can also be referred to, individually (in the case of a single gate spacer) or collectively, as gate spacers 702/704. The shapes and formation methods of the gate spacers 702/704 as illustrated in FIG. 7 (and the following figures) are merely non-limiting examples, and other shapes and formation methods are possible. These and other variations are fully intended to be included within the scope of the present disclosure.

Corresponding to operation 212 of FIG. 2, FIG. 8 is a cross-sectional view of the FinFET device 300 including a number of source/drain regions 800 at one of the various stages of fabrication. The source/drain regions 800 are formed in recesses of the fin 404 adjacent to the dummy gate structures 600. For example, the source/drain regions 800 and the dummy gate structures 600 are alternately arranged. In other words, at least one source/drain region 800 is sandwiched between adjacent dummy gate structures 600 and/or merely one side of the source/drain region 800 is disposed next to a dummy gate structure 600. The recesses are formed by, e.g., an anisotropic etching process using the dummy gate structures 600 as an etching mask, in some embodiments, although any other suitable etching process may also be used.

The source/drain regions 800 are formed by epitaxially growing a semiconductor layer in the recess, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof.

As illustrated in FIG. 8, the epitaxial source/drain regions 800 may have surfaces raised from respective surfaces of the fin 404 (e.g. raised above the non-recessed portions of the fin 404) and may have facets. In some embodiments, the source/drain regions 800 of the adjacent fins may merge to form a continuous epitaxial source/drain region (not shown). In some embodiments, the source/drain regions 800 of the adjacent fins may not merge together and remain separate source/drain regions 800 (not shown). In some embodiments, when the resulting FinFET device is an n-type FinFET, the source/drain regions 800 can include silicon carbide (SiC), silicon phosphorous (SiP), phosphorous-doped silicon carbon (SiCP), or the like. In some embodiments, when the resulting FinFET device is a p-type FinFET, the source/drain regions 800 comprise SiGe, and a p-type impurity such as boron or indium.

The epitaxial source/drain regions 800 may be implanted with dopants to form source/drain regions 800 followed by an annealing process. The implanting process may include forming and patterning masks such as a photoresist to cover the regions of the FinFET device 300 that are to be protected from the implanting process. The source/drain regions 800 may have an impurity (e.g., dopant) concentration in a range from about $1 \times 10^{19}$ $cm^{-3}$ to about $1 \times 10^{21}$ $cm^{-3}$. P-type impurities, such as boron or indium, may be implanted in the source/drain regions 800 of a p-type transistor. N-type impurities, such as phosphorous or arsenide, may be implanted in the source/drain regions 800 of an n-type transistor. In some embodiments, the epitaxial source/drain regions 800 may be in situ doped during their growth. Such a doping process can be the doping process described with regards to FIG. 16, can be an additional process, or can be omitted. For example, a plurality of doping operations can be performed to dope a plurality of junctions, as are described herein.

Figure 9:
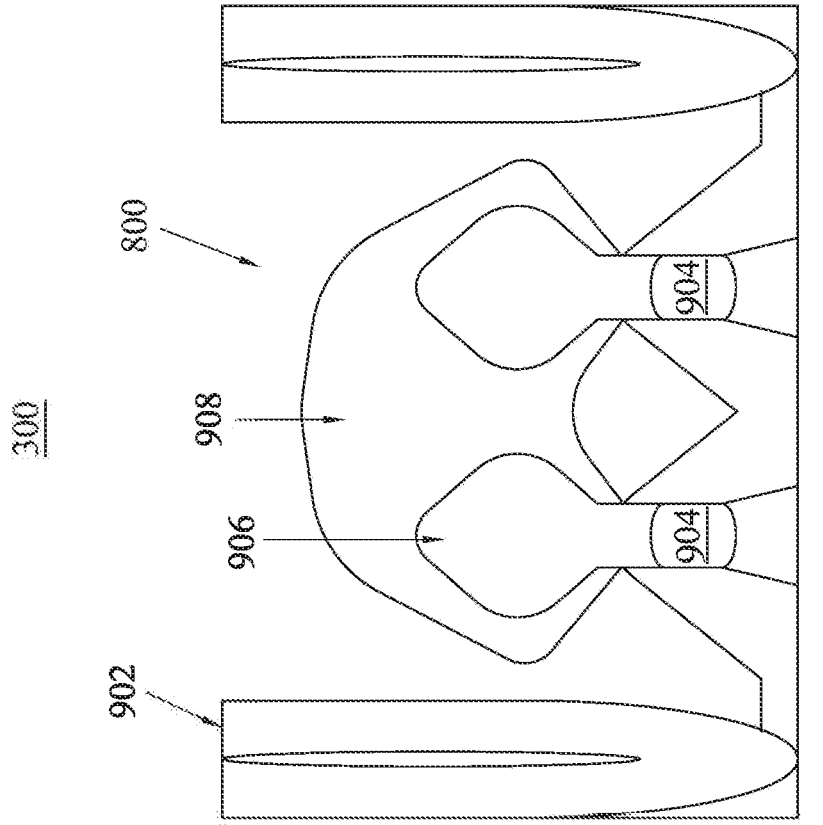

FIGS. 9-10, 12, 14, and 16-17 show cross-sectional views cut along a lengthwise direction of the dummy gate (B-B in FIG. 1), while the cross-sectional views of FIGS. 13, 15, and 18-19 are cut along a lengthwise direction of the channel (A-A in FIG. 1). Further, FIGS. 9-10, 12, 14, and 16-17 show one source/drain region 800 formed across two adjacent fin 404 structures. Alternatively stated, the corresponding source/drain regions of these two fin structures 404 merge with each other. For example, FIG. 9 shows the region of the source/drain region 800 of FIG. 8 upon the first source drain region being formed, wherein the source/drain region 800 is epitaxially grown.

With continued correspondence to operation 212 of FIG. 2, FIG. 9 depicts a semiconductor device such as the FinFET device 300 of FIG. 8. For example, the FinFET device 300 can include a source/drain region 800. The source/drain region 800 can be bounded by an isolating material 902, such as a dielectric (e.g., may be the STI region 500). The source/drain region 800 can be formed (e.g., epitaxially grown) over the fins of the semiconductor device. The semiconductor layer can include a dopant. For example, the dopant can be implanted into the semiconductor layer during or after growth or other formation thereof. The semiconductor layer can include a first portion 904, a second portion 906, and a third portion 908. Each region can be formed from one or more semiconductor layers (e.g., a silicon germanium alloy). Various regions can be formed from various semiconductor layers (e.g., silicon, germanium, gallium arsenide, an alloy or combination thereof, or the like). One or more portions can include a dopant. For example, a plurality of different portions can be a same semiconductor material with a different doping. For example, the portions can be formed and doped iteratively, or the source/drain region 800 can include a gradient of doping, wherein the regions are defined by a dopant concentration threshold. In some embodiments, the source/drain region 800 can be formed over a plurality of fins of the FinFET device 300.

A corresponding drain/source region 800 can be formed (e.g., epitaxially grown) over another portion of the fin. For example, a drain/source region 800 can be a source and the corresponding drain/source region 800 can be a drain. The source and drain can be symmetrical or asymmetrical (e.g., the respective drain/source regions 800 can vary in operation, material, dopant, or the like. The corresponding drain/source region 800 can be formed opposite of a location of a gate. The formation of the gate is further described at operation 216. The corresponding drain/source region 800 can be formed prior or subsequent to the gate. Indeed, the various operations of FIG. 2 can be performed in various sequences.

Figure 10:
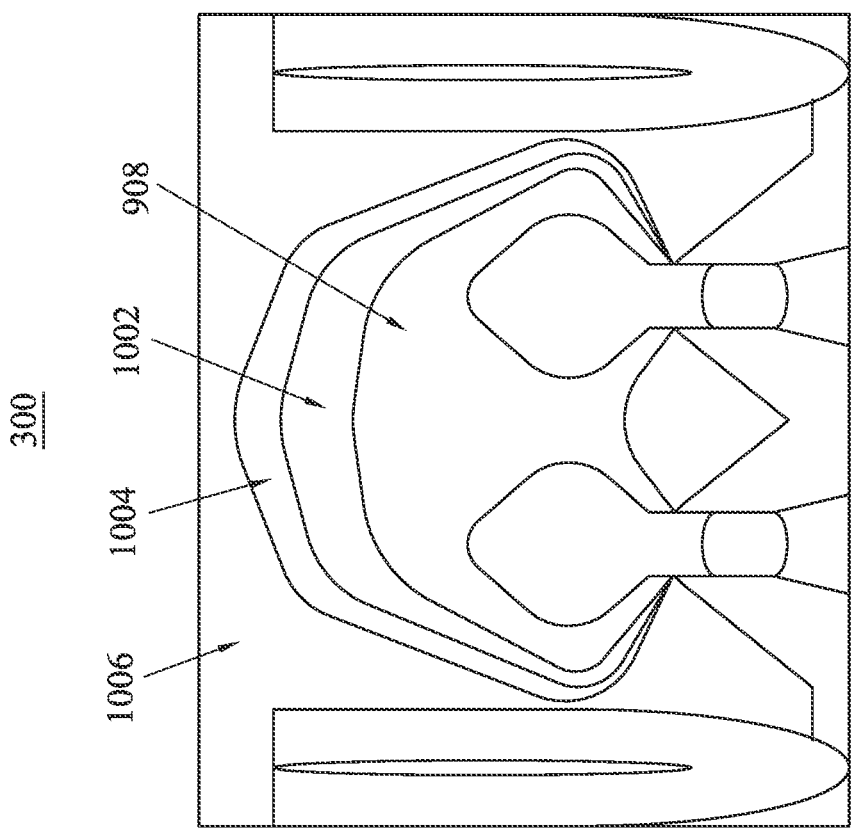

Corresponding to operation 214 of FIG. 2, FIG. 10 is a cross-sectional view of the FinFET device 300 including a contact etch stop layer (CESL) formed over the structure illustrated in FIG. 9. The CESL can function as an etch stop layer in a subsequent etching process, and may comprise a suitable material such as silicon oxide, silicon nitride, silicon oxynitride, combinations thereof, or the like, and may be formed by a suitable formation method such as CVD, PVD, combinations thereof, or the like.

The CESL can include various portions thereof. For example, the CESL can include a first CESL layer 1002 and a second CESL layer 1004. The first CESL layer 1002 and the second CESL layer 1004 can be different materials. For example, the first CESL layer 1002 and the second CESL layer 1004 can be disposed sequentially over the third portion 908 of the semiconductor layer (e.g., silicon germanium). The various CESL layers can be selectively etched. For example, one or more etchants can be used to etch a second CESL layer 1004 which can selectively etch the first CESL layer 1002 or the second CESL layer 1004. In some embodiments, the semiconductor layer or the CESL layer can abut the isolating material 902 (e.g., the STI region 500). In some embodiments, an ILD 1006 can be formed over the CESL layers, as is further discussed with regard to FIG. 12, and others.

Figure 11:
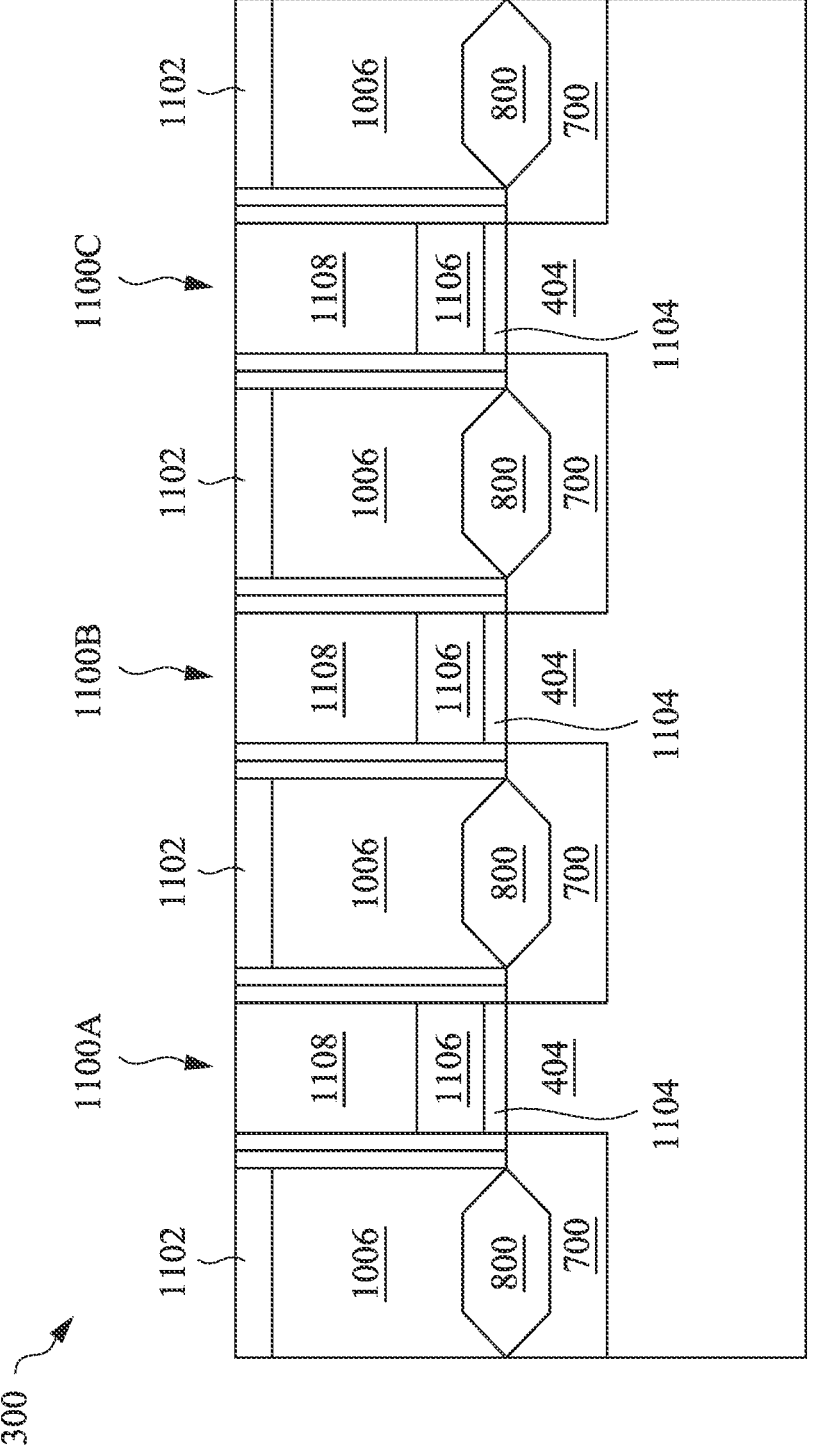

Corresponding to operation 216, FIG. 11 is a cross-sectional view of the FinFET device 300 including a plurality of gate assemblies 1100A, 1100B, 1100C formed over the fins 404. The gate assemblies 1100A, 1100B, 1100C can be formed by etching back at least a portion of the dummy gate structures 600A, 600B, and 600C of FIG. 7. The removal of the dummy gate structures 600A, 600B, and 600C can reveal a channel region of the fin. In some embodiments, the removal of the dummy gate structures 600A, 600B, and 600C is by an etchant or other process that is specific to one or more of the spacers, such that the dimensions of the area over the gate can be defined by the selective etching of the spacers. In some embodiments, a cap layer 1102 can be formed over the drain/source regions 800 (e.g., over an ILD 1006 thereof). For example, the cap layer 1102 can be formed over a surface of the FinFET device 300 and selectively removed to expose the upper surface of the gate portion. In an further example, the cap layer 1102 can be selectively deposited over the ILD 1006.

Figure 20:
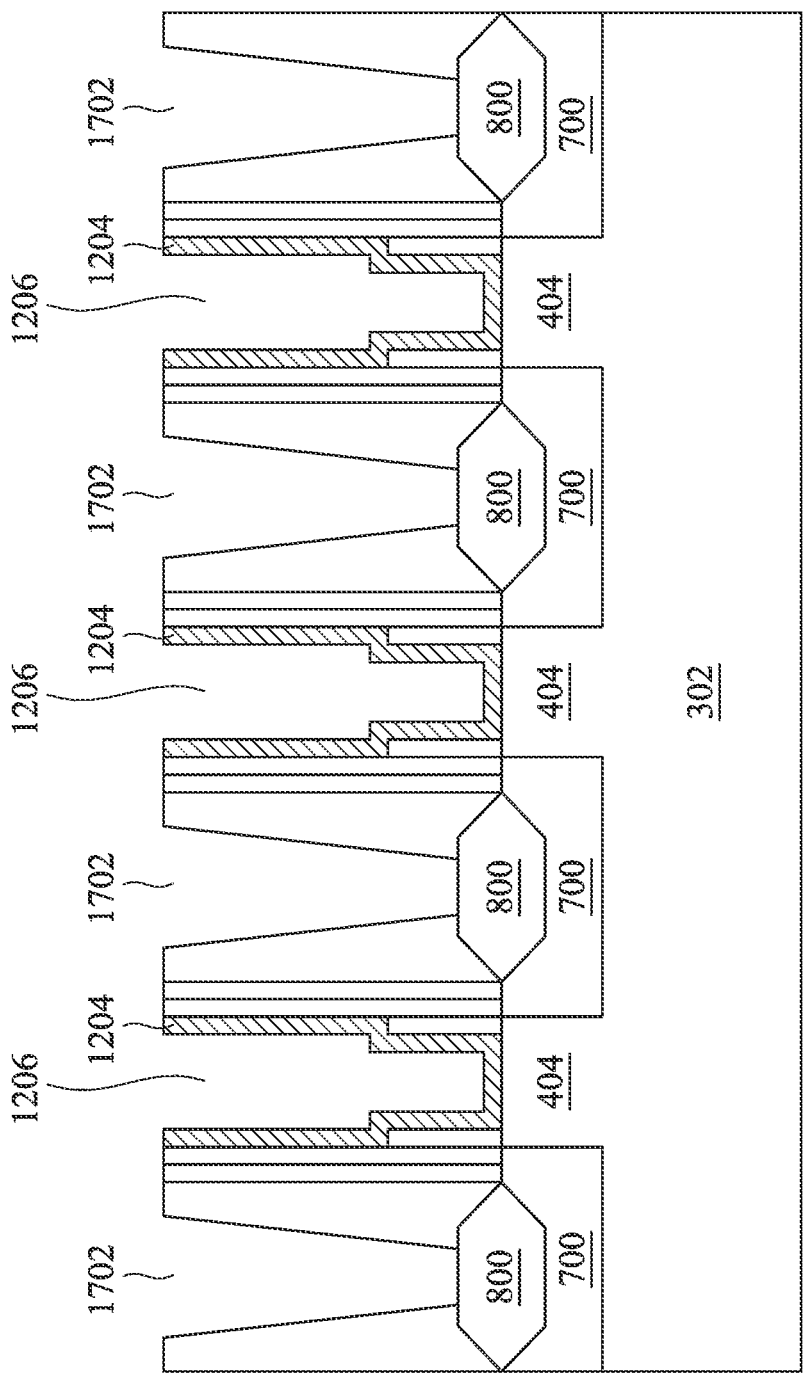

The gate assembly can include a gate dielectric 1104 formed over the fin 404. The gate dielectric 1104 can be or include a high k dielectric, or various dopants applied to the channel portion of the fin 404. The gate dielectric can include at least a portion of the dummy gate 604, or can replace the dummy gate 604. The gate assembly 1100A can include gate electrode 1106, such as a metal gate electrode 1106 comprising cobalt (Co), copper (Cu), gold (Au), cobalt (Co), tungsten (W), combinations thereof, multi-layers thereof, alloys thereof, or the like. The gate electrode 1106 can be or include a gate assembly 1100A portion of an interconnect structure which is connected to various other interconnect structures to form circuits by the electrical connection of various gates, drains, sources, and so on. The gate electrode 1106 can include a hardmask 1108 to cover an upper surface thereof. The hardmask can be pierced to connect the gate electrode 1106 to an interconnect structure (as discussed with regard to FIG. 20), or can include a lateral element to connect the electrode to the interconnect structure in position laterally offset from the depicted gate electrode 1106.

As described above, the gate assembly 1100A can be formed prior to any of operations 212 to 228, or subsequent to. Thus, the metal gate electrode 1106 and the gate dielectric 1104 can be present. The gate electrode 1106 (e.g., the metal gate electrode 1106) can be connected prior or subsequent to operations 212 to 228 (excepting operation 216). For example, the gate can be connected in the depicted plane, or in lateral dimensions, such as would be depicted into or out of the page. The offset of the gate drain in one or more lateral dimensions may increase an offset tolerance of a FinFET device formed with self-aligned contacts.

Figure 12:
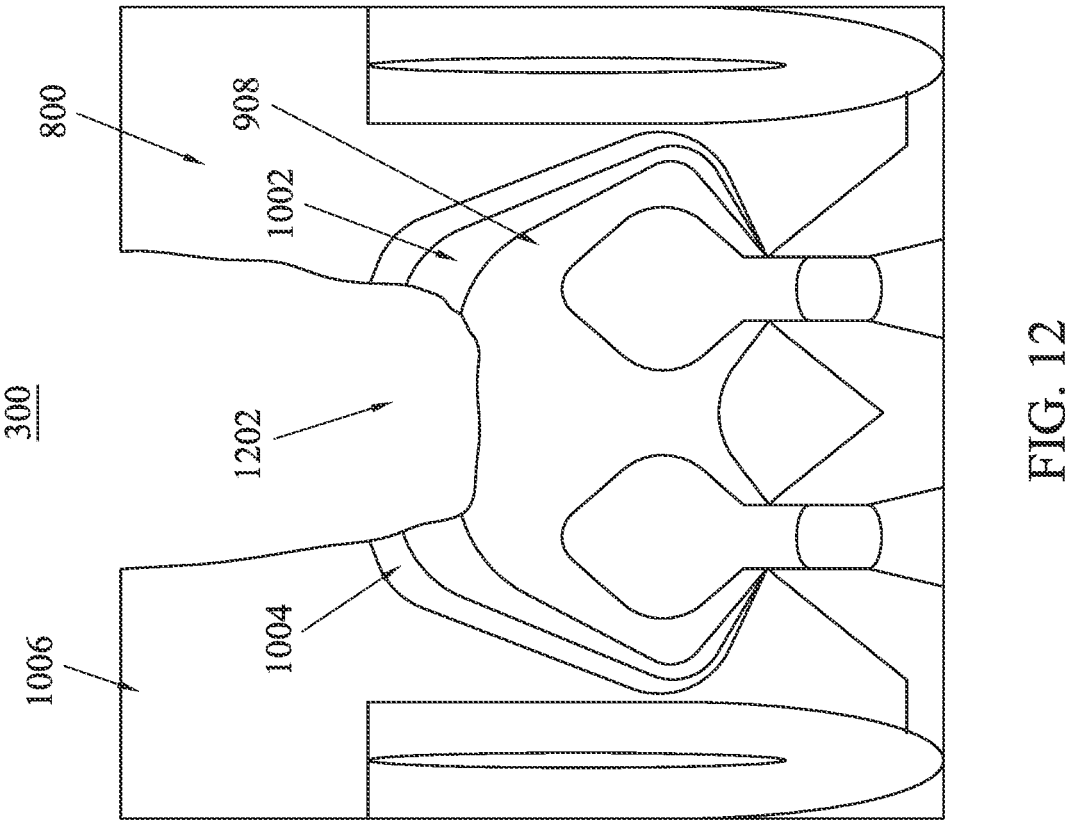

Corresponding to operation 218 of FIG. 2, FIG. 12 is a cross-sectional view of the FinFET device 300 including a recess 1202 formed therein. The recess 1202 can be formed by a directional etching process, such as a plasma etching process, a laser ablation process, a photolithographic process, or the like. The recess 1202 can be formed directly over the semiconductor layer (e.g., silicon germanium) or the CESL (e.g., silicon nitride), such as through air or a vacuum. The recess 1202 can be formed in an ILD 1006 or other material disposed over the source/drain regions 800.

The recess 1202 formed through the CESL or the dielectric of the source/drain region can extend through an ILD 1006 other layer disposed over the grown dielectric of the source/drain region 800. The ILD 1006 can be a same ILD 1006 as a gate or dummy gate region, or can be a different ILD 1006. The recess 1202 can be formed by one or more processes disclosed herein, or known in the art. For example, a photolithographic process can remove an ILD 1006 over the CESL (e.g., an etchant specific to the ILD 1006 can etch the ILD 1006 and not etch the CESL or etch the CESL to a lesser extent). A second process can remove the CESL. For example, a sputter etch process can remove the CESL. The process to remove the CESL can be specific to the CESL, or can be applied to a surface of the semiconductor device wherein a constitution or thickness of an upper surface (e.g., a hard mask) of the semiconductor device can protect other portions of the FinFET device 300. In some embodiments, a plurality of CESL layers (e.g., a first CESL layer 1002 and a second CESL layer 1004) can be specific to one or more etches such that a plurality of operations are employed to remove the CESL.

Figure 13:
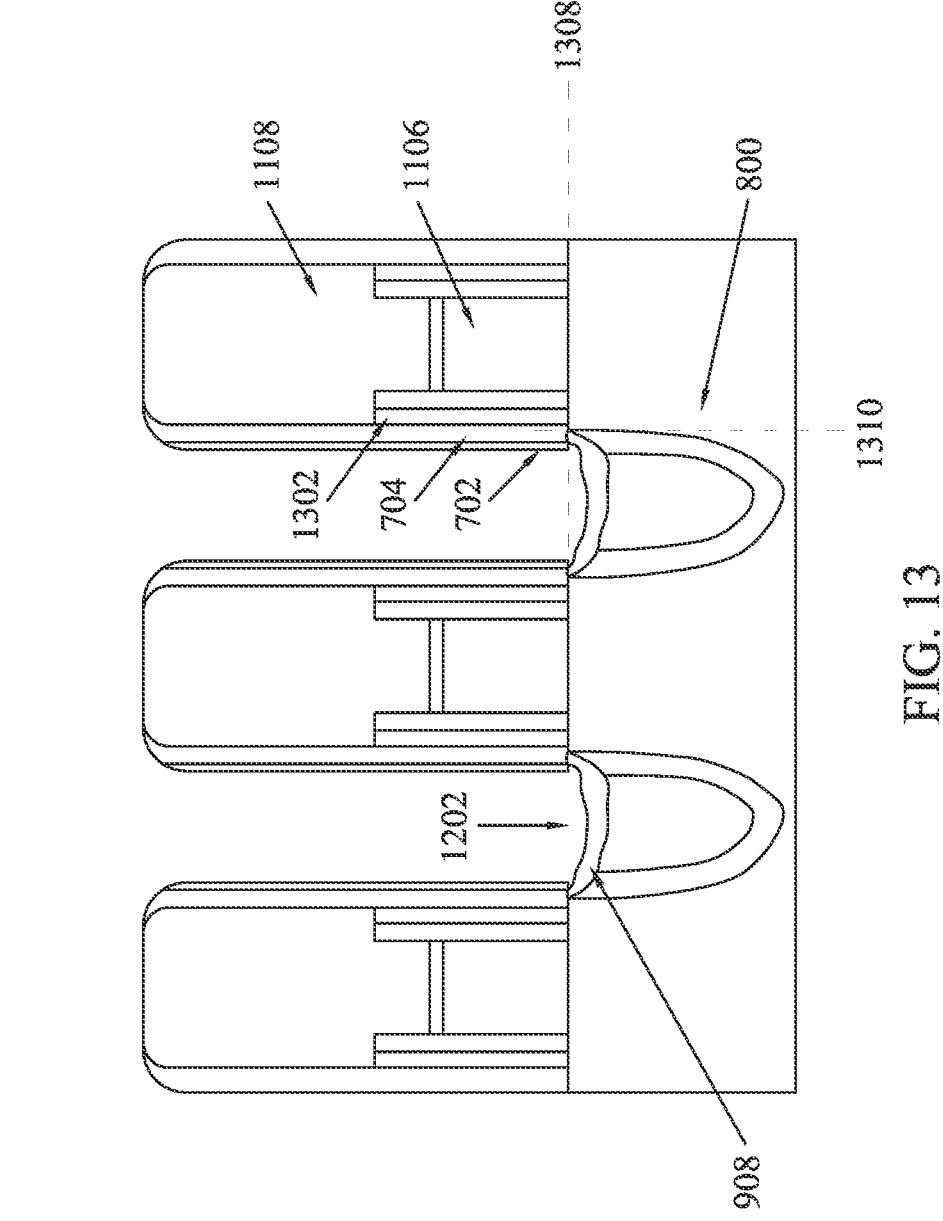

With continued correspondence to operation 218, FIG. 13 depicts a perpendicular cross-section of the FinFET device 300 including a recess 1202 formed therein as depicted in FIG. 12. As noted above, FIG. 13 can depict the FinFET device 300 of FIG. 12 along a perpendicular view. Depicted are a first gate spacer 702, a second gate spacer 704, and an additional spacer 1302 disposed over the source/drain regions 800 above a lateral plane 1308 extending along an upper surface of the source/drain regions 800. As depicted, the spacers can be disposed over a portion of the source/drain regions 800. In some embodiments, the spacers can be disposed at or beyond a lateral extreme 1310 of the source/drain region 800 or a portion thereof. The various gate spacers 702/704 can be of varying dimension or material. For example, the first gate spacer 702 can be of greater or lesser height than the second gate spacer 704 or the additional spacer 1302. The first gate spacer 702 can be resistant to the etchant used to remove an ILD 1006 or other material over the source/drain region 800. The height of the first gate spacer 702 or another spacer can be defined by a height of the ILD 1006 or other material. For example, the spacer 702/704 height can be a function of the construction of the dummy gate structure 600, or gate electrode 1106.

Also depicted in FIG. 13 is a metal gate electrode 1106 having a dielectric cap 1206 such as a hard mask layer disposed thereupon. The depicted metal gate electrode 1106 can be formed according to operation 216. In embodiments, using a gate first process, the metal gate electrode 1106 can be formed prior to the completion of operation 218. An ILD 1006 can be formed over the source/drain regions 800 according to as self-aligned contact operation.

According to the self-aligned contact operation, the metal gate electrode 1106 can be formed (e.g., in the first instance or to replace the dummy gate, and etched back thereafter). The ILD 1006 can be formed prior, or subsequent to forming or etching back the metal gate electrode. For example, the ILD 1006 can be formed prior to forming the metal gate electrode, and thereafter removed. A cap layer such as a hard mask, additional dielectric layer, or material having a higher resistivity than the contacts can be formed over the etched back metal gate electrode. The ILD 1006 can be selectively etchable relative to the cap layer, such that a misalignment of the recess 1202 over the gate electrode 1106 may not expose a conductive portion thereof (e.g., so that a conductive material filling the recess 1202 does not electrically connect the gate to the source/drain regions 800). For example, the ILD 1006 can be an oxide layer, and the cap layer can be a nitride layer.

In some embodiments, the ILD 1006 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. After the ILD 1006 is formed, a dielectric layer can be formed over the ILD 1006. The dielectric layer can function as a protection layer to prevent or reduces the loss of the ILD 1006 in subsequent etching processes. The dielectric layer may be formed of a suitable material, such as silicon nitride, silicon carbonitride, or the like, using a suitable method such as CVD, PECVD, or FCVD. After the dielectric layer is formed, a planarization process, such as a CMP process, may be performed to achieve a level upper surface for the dielectric layer. Indeed, various processes described herein may include or be followed by a planarization, treatment, cleaning, or other intermediate operation.

In some embodiments, the source/drain region 800 can be doped. For example, the source/drain region 800 or a portion thereof can be lightly or heavily doped. For example, the source/drain region 800 can be doped prior to or following the formation of the recess (e.g., immediately following the epitaxial growth of the source/drain regions).

Figure 14:
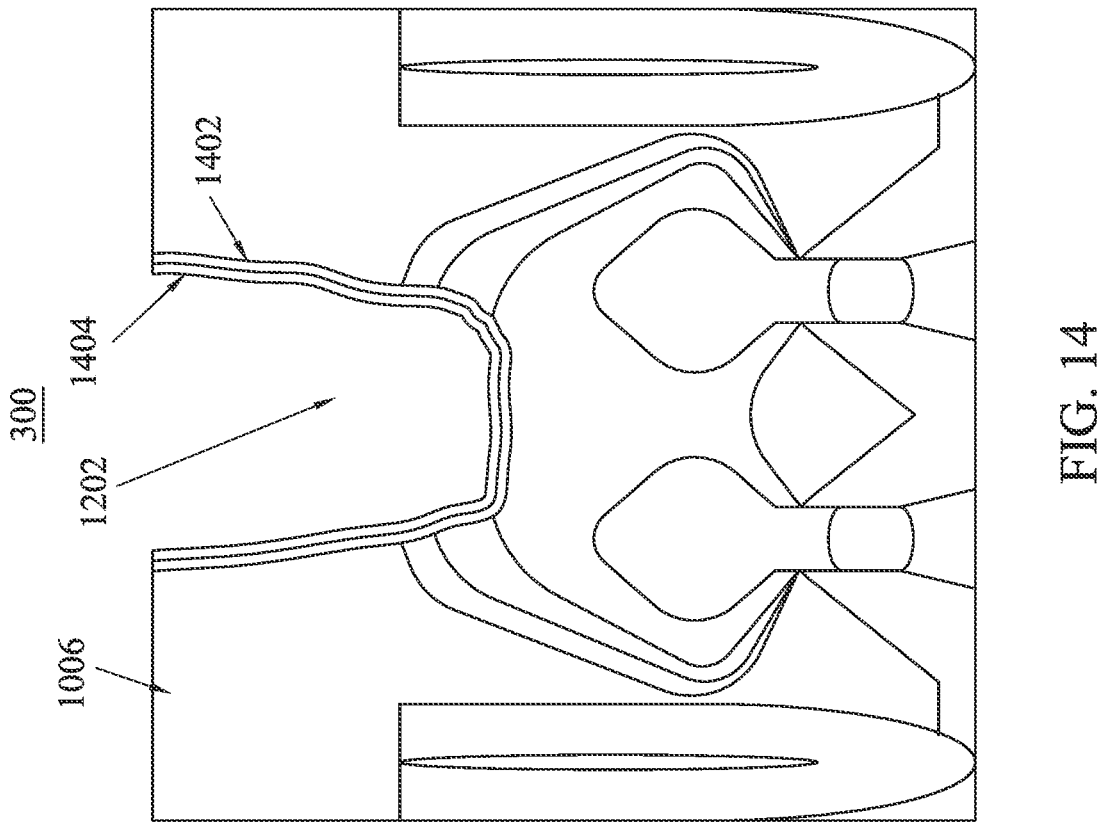

Corresponding to operations 220 and 222 of FIG. 2, FIG. 14 is a cross-sectional view of the FinFET device 300 including a silicon layer 1402 and a metal layer, such as a titanium layer 1404 disposed thereupon. The silicon layer 1402 and titanium layer 1404 can be formed by any suitable deposition method. The silicon layer 1402 and titanium layer 1404 can be formed by a similar or dissimilar method. In some embodiments, the titanium layer 1404 can be formed using a CVD process, such as PECVD. In some embodiments, a process such as sputtering, metal organic chemical vapor deposition (MOCVD), or ALD, may be used to form the titanium layer. The titanium layer can include elemental titanium, titanium nitride, or various alloys or combinations thereof. The silicon layer 1402 (e.g., polysilicon or an oxide thereof) can be formed according to one or more operations, such as the processes described with respect the titanium layer 1404 or another operation. For example, the silicon layer can be epitaxially grown over a deposited seed layer, or deposited as an oxide according to various deposition processes.

The silicon layer 1402 or titanium layer 1404 can each be formed having a generally uniform thickness. In some embodiments, the silicon layer 1402 and titanium layer 1404 can be of a fixed molar ratio. For example, a molar ratio of about two parts silicon for every part titanium can be defined. Such a ratio may be intended to completely consume each material to form a silicon titanium alloy such as titanium dioxide. In some embodiments, the molar ratio of about two parts silicon for every part titanium can be adjusted, such as according to a desired silicide composition (e.g., in combination with other components deposited proximal to the silicon layer 1402 or titanium layer 1404), or according to a desired interaction between the silicon layer 1402 and the titanium layer 1404. For example, the molar ratio can be silicon biased (e.g., to about 3 or about 2.2 parts silicon for every part titanium) to avoid or mitigate a consumption of another portion of the FinFET device 300 (e.g., the third portion 908 of the source/drain region 800, such as silicon germanium). In another example, the molar ratio can be titanium biased (e.g., to about 1 or about 1.8 parts silicon for every part titanium) to avoid or mitigate a latent silicon layer which may electrically isolate the silicide from the source/drain region. In various embodiments, other metal silicides can be formed. The various metal silicides can be associated with various molar ratios according to the uniformity of the thickness of the layers, the chemical compositions of the various silicides, and the desired resistivities for the connections. For example, in some embodiments, a metal layer can be deposited by a directional process which may deposit a thicker layer at a center of the recess 1202, such that the surface of the contact area between the silicide and the source/drain region may be increased (which may decrease resistance therebetween).

Figure 15:
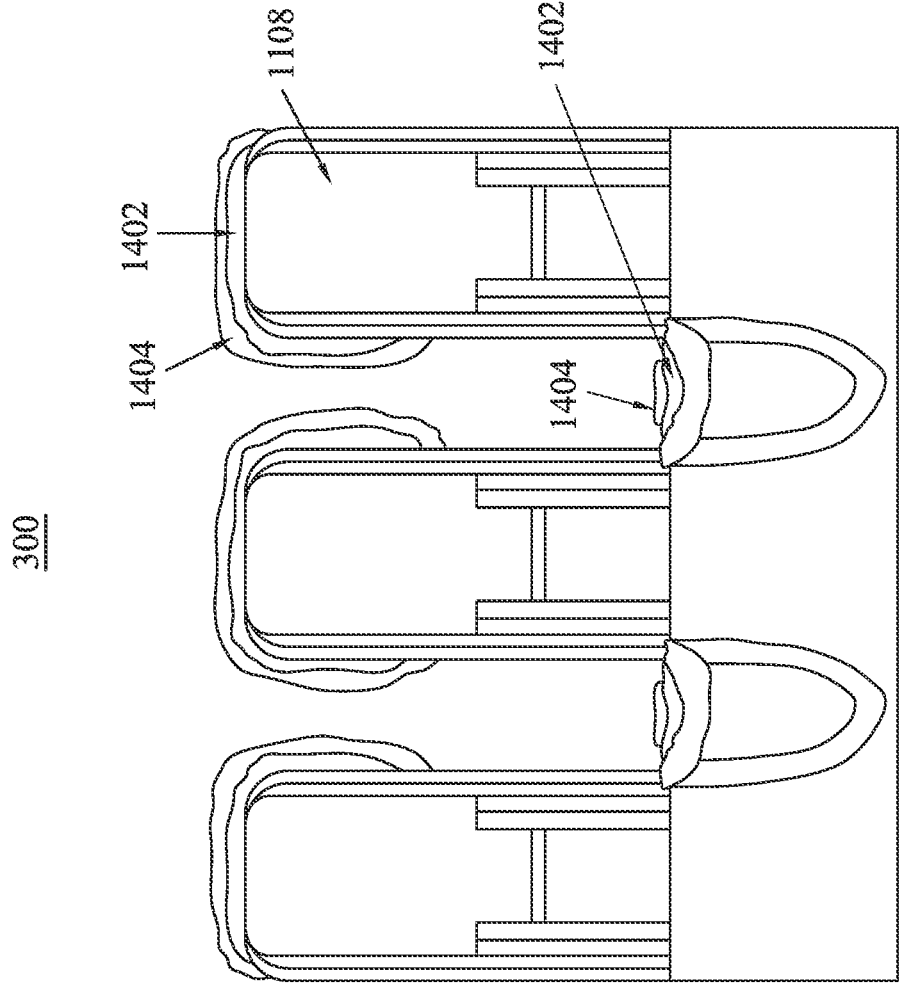

With continued correspondence to operations 220 and 222, FIG. 15 depicts a perpendicular cross-section of the FinFET device 300 including a titanium layer and a silicon layer disposed thereupon, as shown in FIG. 14. As depicted, the silicon layer 1402 or titanium layer 1404 can form over additional features of the FinFET device 300, such as a dummy gate structure 600, or dielectric cap. In some embodiments, the portion of the silicon layer 1402 or titanium layer 1404 (or additional features of the FinFET device 300) can be removed, such as by a planarization or grinding process (e.g., CMD/G). For example, the layers can be removed immediately subsequent to the formation of the respective layers, or during another operation.

Figure 16:
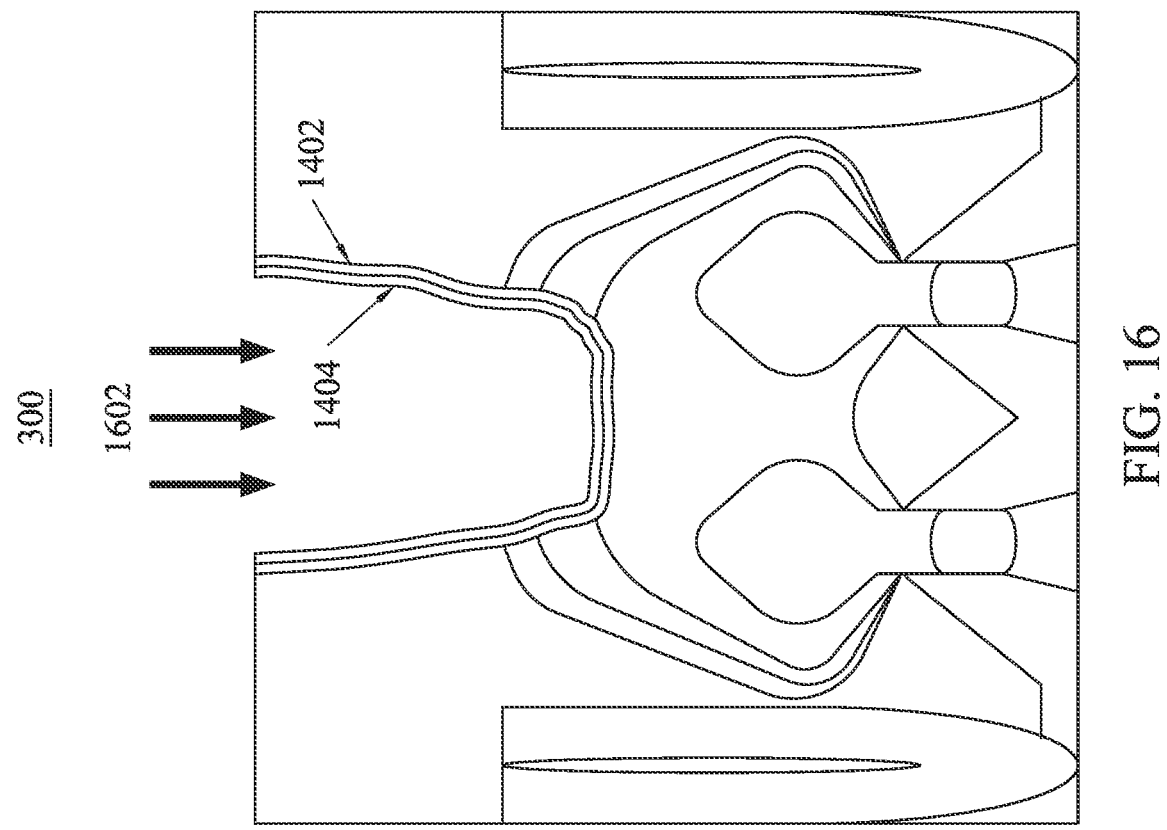

Corresponding to operation 224 of FIG. 2, FIG. 16 is a cross-sectional view of the FinFET device 300 including a dopant 1602 implanted in the surface thereof. For example, a p-type dopant (e.g., boron) or n-type dopant 1602 (e.g., phosphorus) can be provided to increase an electron mobility of the silicide or proximate material. For example, the dopant 1602 can be implanted into a surface of the silicon layer 1402 or the titanium layer 1404 such that upon the annealing of the layers, the dopant 1602 can migrate (e.g., diffuse) to a surface of the source/drain region 800. The dopant 1602 can adjust the work function interface between a semiconductor of the source/drain region 800 and the silicide, or between the silicide and the metal conductor (e.g., to generate or improve an Ohmic contact therebetween).

Figure 17:
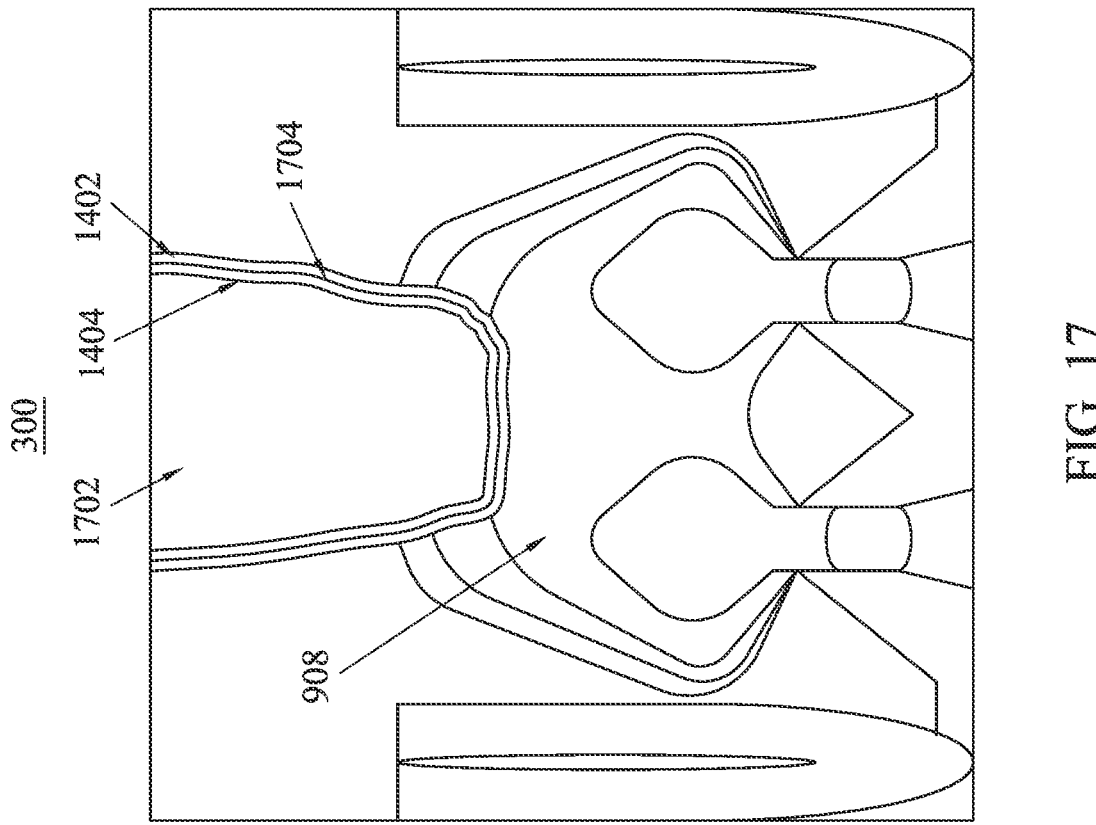

Corresponding to operations 226 and 228 of FIG. 2, FIG. 17 is a cross-sectional view of the FinFET device 300 including an interconnect structure 1702. The interconnect structure 1702 can electrically connect various portions of the FinFET device 300. For example, the interconnect structure 1702 can be formed in layers such that a first layer of the interconnect structure can be a source electrode or drain electrode of the FinFET device 300. The source or drain electrodes can connect to other portions of the semiconductor device to form circuits. For example, the interconnect structure 1702 can be formed from alternating layer and connections therebetween. The various layers of the interconnect structure 1702 can include any suitable metal, such as cobalt (Co), copper (Cu), gold (Au), cobalt (Co), tungsten (W), combinations thereof, multi-layers thereof, alloys thereof, or the like. The layer of the interconnect structure can be formed by a suitable method, such as PVD, CVD, electroplating, electroless plating, or the like.

At least the silicon layer 1402 and titanium layer 1404 disposed within the recess can be annealed to form a titanium silicide layer 1704. The titanium silicide layer 1704 can consume all or a substantial portion of the silicon layer 1402 or the titanium layers 1404. In some embodiments, the titanium silicide layer 1704 can consume a portion of the source/drain region 800 such as the third portion 908 thereof. The titanium silicide layer 1704 is further described with respect to FIGS. 17 and 18.

Figure 18:
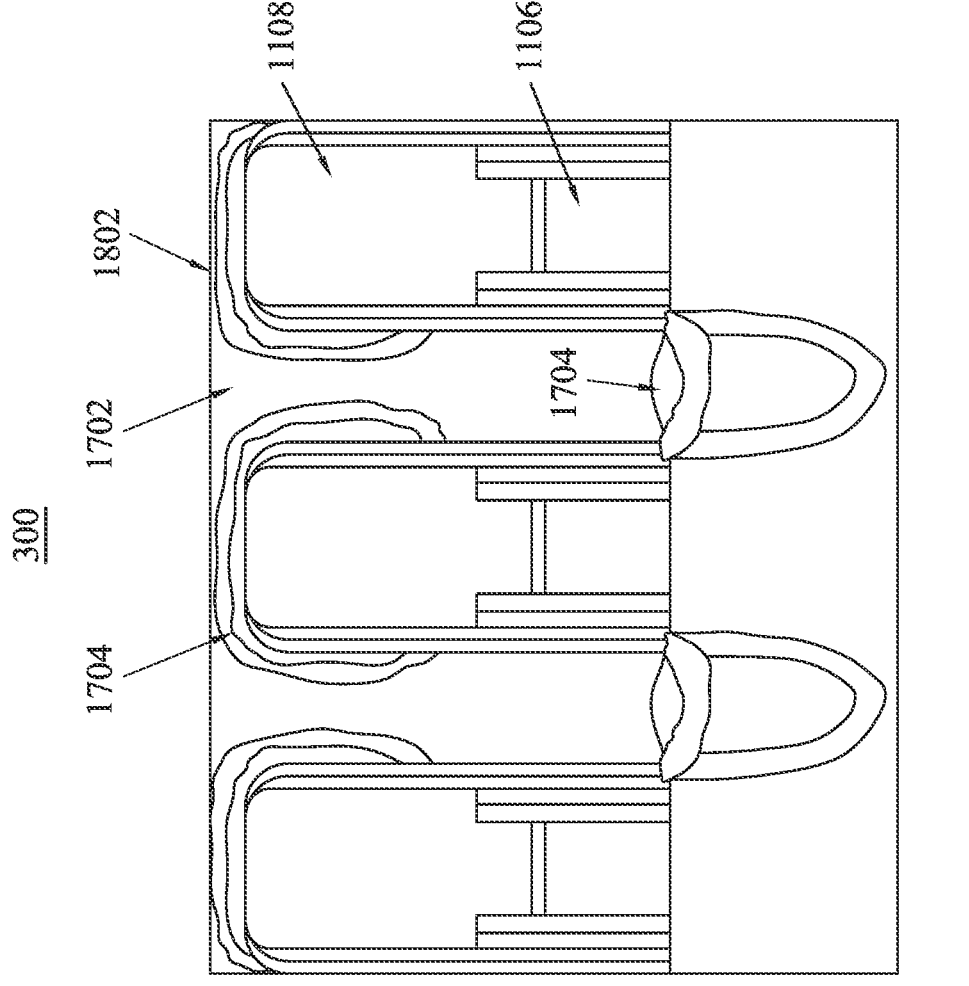

With continued correspondence to operations 226 and 228, FIG. 18 depicts a perpendicular cross-section of the FinFET device 300 including the annealed silicide layer 1704 (e.g., titanium silicide) and the interconnect structure 1702 disposed thereupon. A contact surface between the silicide layer 1704 and the interconnect structure 1702 can be convex, concave, or linear. For example, a concave contact area can increase a surface area, relative to a flat surface and be realizable by annealing the layers along the recess 1202 formed as depicted in FIG. 12.

In some embodiments, a spacer or other barrier can avoid the interconnection 1802 between the interconnect structure 1702 portions disposed over the various source/drain regions 800. For example, the interconnect structure 1702 material (e.g., cobalt) can be deposited to a depth of less than the height of one or more of the spacers 702/704, the metal gate electrode 1106, the dielectric cap 1206, or the dummy gate. In some embodiments, the upper surface of the semiconductor device can be reduced, to remove an undesired interconnection 1802 such as by a planarization or grinding process (e.g., CMP/G).

The silicide can be formed by annealing the silicon layer 1402 and the titanium layer 1404 subsequent to the deposition of the interconnect structure 1702. For example, the annealing can be accomplished with a lower energy or time (e.g., relative to an operation which anneals the silicon layer 1402 and the titanium layer 1404 following the addition of a portion of the interconnect structure 1702), which may reduce a thermal load applied to other portions of the FinFET device 300 (e.g., which may reduce a diffusion of various components thereof). In some embodiments, the annealing can be performed following the deposition of at least a portion of the interconnect structure 1702. For example, the annealing can be performed at a lower temperature than the reflow temperature of the interconnect structure 1702. For example, the annealing can be performed at 200° C.-1125° C., such as at 200° C.-300° C.

Figure 19:
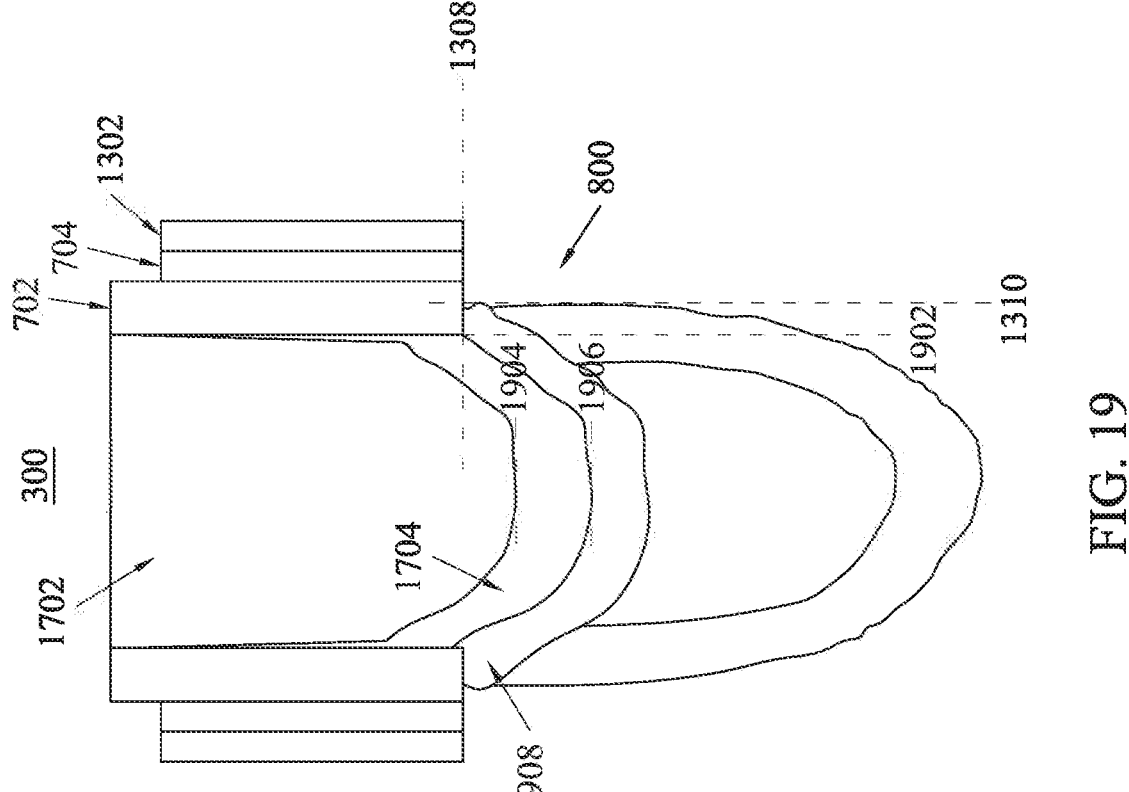

With continued correspondence to operations 226 and 228, FIG. 19 depicts a same cross-section of the FinFET device 300 including the annealed metal silicide layer 1704 and the interconnect structure 1702 disposed thereupon. For example, the FinFET device 300 can include a same source/drain region 800 as the FinFET device 300 of FIG. 19, or a variant thereof. Depicted are interfaces between and within the various semiconductor layers of the source/drain region 800, the CESL, the silicide layer 1704, and the spacers. Variations thereof can be employed, such as according to other disclosures herein.

The lateral extreme 1310 of the source/drain region 800 extends under the first gate spacer 702. In some embodiments, source/drain region 800 can extend under additional (e.g., all) or no spacers 702/704. According to some embodiments, the silicide layer 1704 (e.g., $TiSi_2$) can extend to a lesser lateral dimension. For example, the lateral extreme 1902 of the silicide layer 1704 can extend to a lesser dimension than the lateral extreme 1310 of the source/drain region 800. The differences in lateral extreme can prevent extrusion of the silicide layer 1704, such as to avoid short circuiting between the silicide layer 1704 and another feature of the FinFET device 300, or a loss of metal (e.g., titanium) such that a silicon boundary prevents or increases a resistivity of a connection between the silicide layer 1704 and the interconnect structure 1702. Further, in some embodiments, the lateral extreme 1902 of the silicide layer 1704 can be generally aligned with the first gate spacer 702, such that the silicide layer 1704 does not substantially undercut the first gate spacer 702 (e.g., undercuts by no more than 1, 2, or 3 nm). In some embodiments, the silicide layer 1704 can be laterally spaced from any of the spacers 702/704, such as the first gate spacer 702. For example, the silicide layer 1704 can be laterally spaced inward from the spacers 702/704 (e.g., 1, 2, or 3, nm therefrom).

As depicted, a portion of the source/drain region 800, such as an upper portion of silicon germanium bounds a lower junction of the silicide layer 1704. Thus, the silicide layer 1704 can be described by the same relationships with the one or more spacers (e.g., the first gate spacer 702, the second gate spacer 704, or the additional spacer 1302). For example, the third portion 908 of the source/drain region 800 can abut one or more of the spacers. In some embodiments, the source/drain region can contain additional, fewer, or differently defined portions (e.g., may be a homogenous material or a homogenously doped material). For example, a center portion can be of a different constitution that a portion laterally bounding or approaching the spacers 702/704 (e.g., due to an interference/masking of another semiconductor feature with the doping thereof).

In various embodiments, one or more spacers can be placed prior to the formation, doping, annealing or other process involving the source/drain regions 800; the lateral spacing between the upper surface of the source/drain regions 800 and the spacers 702/704 can be varied accordingly. The spacer 702/704 dimensions, heights, and number can also vary. For example, the first gate spacer 702 immediately bounding the interconnect structure 1702 can extend vertically above the other spacers, at a same height, or lower than the other spacers.

A vertical extreme 1904 of the interconnect structure 1702 interfaces with an upper surface of the center of the silicide layer 1704 of the source/drain region 800. A vertical extreme 1906 of the silicide layer 1704 interfaces with an upper surface of the source/drain region 800 (as depicted, the third portion 908 thereof). The vertical distance between vertical extreme 1904 of the interconnect structure 1702 and the vertical extreme 1906 of the silicide layer 1704 defines a center thickness of the silicide layer 1704. The center thickness of the silicide layer 1704 can be greatest at the center. In some embodiments, the silicide layer 1704 thickness can be generally consistent (e.g., can vary by no more than a factor of about 1.5, 2, or 3). In some embodiments, the silicide layer 1704 thickness can taper as the layer extends to the spacer. For example, the silicide layer 1704 thickness can taper monotonically extending towards the spacer to reach a thickness of about 50% or about 60% of the center portion. In some embodiments, the taper may not be strictly monotonic (e.g., due to surface roughness) but may nonetheless generally monotonically decrease in dimension approaching the spacers.

In one aspect of the present disclosure, a semiconductor device is disclosed. The semiconductor device includes a semiconductor channel. The semiconductor device includes a metal gate structure disposed over the semiconductor channel. The semiconductor device includes a gate electrode having a bottom surface contacting an upper surface of the metal gate structure. The gate electrode has its side portions extending from its top surface toward the semiconductor fin with a first depth and a central portion extending from its top surface toward the semiconductor fin with a second depth, the first depth being substantially greater than the second depth.

In another aspect of the present disclosure, a method is disclosed. The method includes epitaxially growing a source/drain region within a recess, wherein the source/drain region comprises one or more semiconductor layers. The method includes forming a silicon layer over a top surface of the source/drain region. The method includes forming a titanium layer over the silicon layer. The method includes filling a remaining portion of the recess with a conductive material. The method includes annealing at least the silicon layer and the titanium layer to form a titanium-silicide layer over the source/drain region.

In yet another aspect of the present disclosure, a method for fabricating semiconductor devices is disclosed. The method includes forming a plurality of dummy gates over respective first portions of a fin structure formed over a semiconductor substrate. The method includes forming a plurality of spacers, each of the spacers extending along opposite sidewalls of a corresponding one of the dummy gates. The method includes removing second portions of the fin structure that are not overlaid by the dummy gates or their respective spacers to form a plurality of recesses. The method includes epitaxially growing a plurality of source/drain regions in the recesses. The method includes forming a silicon layer, at least in the recesses, over respective top surfaces of the drain/source regions. The method includes forming a titanium layer, at least in the recesses, over the silicon layer. The method includes filling a remaining portion of the each of the recesses with a conductive material. The method includes annealing at least the silicon layer and the titanium layer to form a titanium-silicide layer over each of the source/drain regions. The method includes forming a plurality of metal gates by replacing the dummy gates, respectively.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor device, comprising:

epitaxially growing a source/drain region within a first recess, wherein the source/drain region comprises one or more semiconductor layers;

forming a second recess defining a concave upper surface of the source/drain region and having sidewalls extending above the source/drain region;

forming a silicon layer over the concave upper surface of the source/drain region and the sidewalls of the second recess;

forming a titanium layer over the silicon layer, over the concave upper surface and the sidewalls of the second recess;

filling a remaining portion of the second recess with a conductive material; and annealing at least the silicon layer and the titanium layer to form a titanium-silicide layer over the source/drain region.

2. The method of claim 1, wherein the titanium-silicide layer consists essentially of titanium from the titanium layer, silicon from the silicon layer, and dopants from at least one of the titanium layer or the silicon layer.

3. The method of claim 1, further comprising:

forming a contact etch stop layer (CESL) over the source/drain region; and forming an interlayer dielectric (ILD) over the CESL, wherein the second recess extends through the ILD and the CESL.

4. The method of claim 1, wherein the one or more semiconductor layers each comprise silicon germanium.

5. The method of claim 1, wherein at least one of the one or more semiconductor layers is in-situ doped prior to forming the titanium layer and the silicon layer.

6. The method of claim 1, wherein forming the source/drain region comprises epitaxially growing one or more of the semiconductor layers from a fin.

7. The method of claim 1, further comprising:

doping at least one of the titanium layer or the silicon layer with a p-type dopant, prior to annealing the silicon layer and the titanium layer.

8. The method of claim 1, further comprising:

prior to filling the remaining portion of the first recess with the conductive material, forming a contact etch stop layer (CESL) over the source/drain region.

9. A method for fabricating a semiconductor device, comprising:

forming a plurality of dummy gates over respective first portions of a fin structure formed over a semiconductor substrate;

forming a plurality of spacers, each of the spacers extending along opposite sidewalls of a corresponding one of the dummy gates;

removing second portions of the fin structure that are not overlaid by the dummy gates or their respective spacers to form a plurality of recesses;

epitaxially growing a plurality of source/drain regions in the recesses, respectively;

forming a silicon layer, at least in the recesses, over respective top surfaces of the source/drain regions;

forming a titanium layer, at least in the recesses, over the silicon layer;

filling a remaining portion of each of the recesses with a conductive material;

annealing at least the silicon layer and the titanium layer to form a titanium-silicide layer over each of the source/drain regions, wherein the titanium-silicide layer interfaces, along a vertical dimension, with at least one spacer of the plurality of spacers; and forming a plurality of metal gates by replacing the dummy gates, respectively.

10. The method of claim 9, wherein the titanium layer comprises titanium nitride (TiN).

11. The method of claim 9, wherein the source/drain regions comprise silicon germanium.

12. The method of claim 9, wherein the titanium-silicide layer does not extend laterally beyond the at least one spacer of the plurality of spacers.

13. The method of claim 9, wherein the titanium-silicide layer extends laterally beyond the at least one spacer of the plurality of spacers by less than about 1 nm.

14. The method of claim 9, further comprising:

doping the source/drain regions prior to forming the silicon layer or the titanium layer.

15. The method of claim 9, wherein a surface of the titanium-silicide layer facing at least one recess of the plurality of recesses is concave.

16. A method for fabricating a semiconductor device, comprising:

forming a plurality of first gates over respective first portions of a fin structure formed over a semiconductor substrate;

forming a plurality of spacers, each of the spacers extending along opposite sidewalls of a corresponding one of the first gates;

removing second portions of the fin structure that are not overlaid by the first gates or their respective spacers to form a plurality of first recesses;

forming source/drain regions in the first recesses;

forming a dielectric layer over the source/drain regions;

forming a second recess through the dielectric layer to expose a concave upper surface of the source/drain region; and forming a silicide layer over the concave upper surface of the source/drain regions.

17. The method of claim 16, wherein the first gates are dummy gates and further comprising:

replacing at least a portion of the first gates with an active gate structure.

18. The method of claim 16, wherein a silicide of the silicide layer is a titanium silicide.

19. The method of claim 16, wherein forming the source/drain regions comprises forming a plurality of successive layers having different dopant concentrations from one-another.

\* \* \* \* \*